(12) United States Patent
Lee et al.

(10) Patent No.: US 7,192,818 B1
(45) Date of Patent: Mar. 20, 2007

(54) POLYSILICON THIN FILM FABRICATION METHOD

(75) Inventors: Si-Chen Lee, Taipei (TW); Chao-Yu Meng, Taipei (TW); Hsu-Yu Chang, Taipei (TW)

(73) Assignee: National Taiwan University, Taipei (TW)

( * ) Notice: Subject to any disclaimer, the term of this patent is extended or adjusted under 35 U.S.C. 154(b) by 9 days.

(21) Appl. No.: 11/231,854

(22) Filed: Sep. 22, 2005

(51) Int. Cl.
*H01L 21/00* (2006.01)
*H01L 21/336* (2006.01)
*H01L 21/20* (2006.01)

(52) U.S. Cl. .................. 438/166; 438/308; 438/378; 438/486

(58) Field of Classification Search ............... 438/149, 438/150, 166, 308, 378, 486, 487
See application file for complete search history.

(56) References Cited

U.S. PATENT DOCUMENTS 6,605,496 B1 * 8/2003 Yamazaki .................. 438/166

* cited by examiner

*Primary Examiner*—Hsien-Ming Lee
(74) *Attorney, Agent, or Firm*—Rosenberg, Klein & Lee (57) ABSTRACT

A polysilicon thin film fabrication method is provided, in which a heat-absorbing layer is used to provide sufficient heat for grain growth of an amorphous silicon thin film, and an insulating layer is used to isolate the heat-absorbing layer and the amorphous silicon thin film. A regular heat-conducting layer is used as a cooling source to control the crystallization position and grain size of the amorphous silicon thin film. Therefore, the amorphous silicon thin film can crystallize into a uniform polysilicon thin film, and the electrical characteristics of the polysilicon thin film can be stably controlled.

9 Claims, 9 Drawing Sheets n+ ion implantation

Fig. 1A
(PRIOR ART)

first excimer laser annealing

Fig. 1B
(PRIOR ART)

second excimer laser annealing

POLYSILICON THIN FILM FABRICATION METHOD

BACKGROUND OF THE INVENTION

1. Field of the Invention

The present invention relates to a polysilicon thin film fabrication method and, more particularly, to a polysilicon thin film fabrication method capable of enhancing the uniformity of grain.

2. Description of Related Art

The low temperature poly Si (LTPS) thin film transistor (TFT) technology will be used in future active matrix LCDs and OLEDs. Although today's LTPS TFTs have good electrical properties, they have the problem of nonuniform characteristics. In order to improve the nonuniform situation of polysilicon thin film between channels, it is necessary to control the size and distributed distance of polysilicon grains.

Figure 1A:
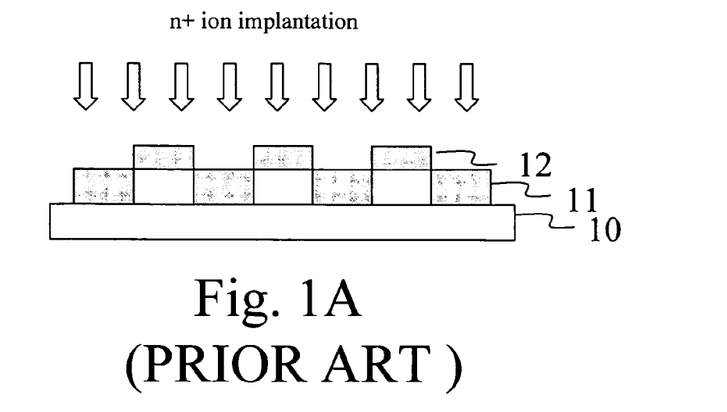
FIGS. 1A–1C show a polysilicon thin film fabrication process flow in the prior art.
Figure 1B:
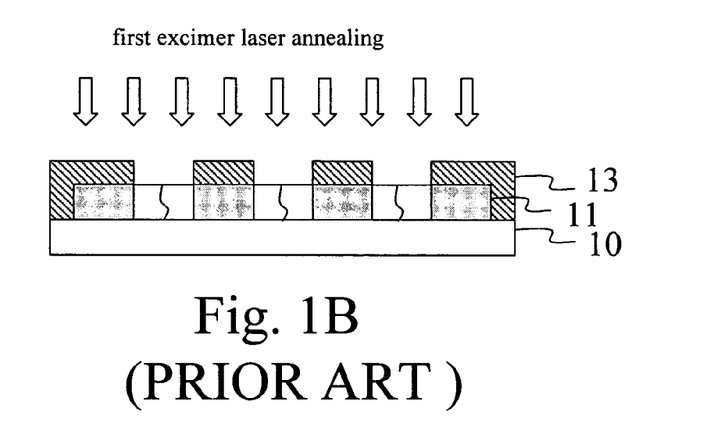
Figure 1C:
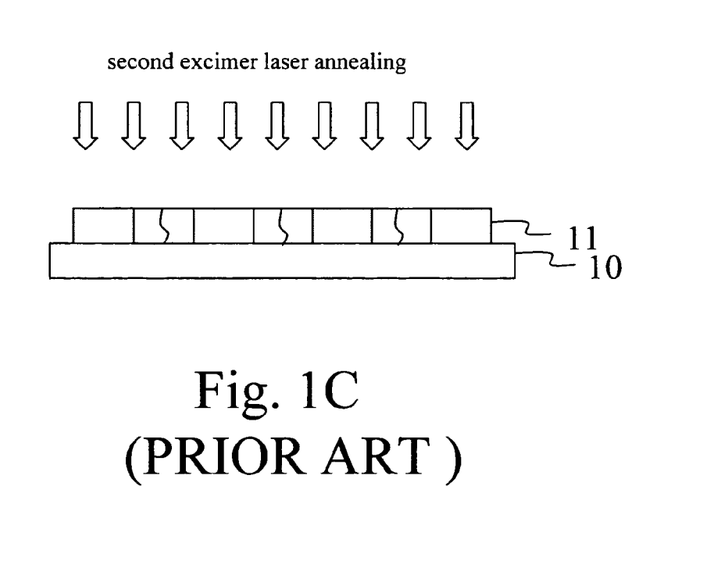

In 2000, Seoul University of South Korea has proposed a polysilicon thin film fabrication method, in which the high reflectivity of aluminum is used as a metallic cooling source for sideward growth. As shown in FIGS. 1A–1C, an amorphous silicon thin film 11 of a thickness of 80 nm is first coated on an oxide substrate 10. Next, n+ ions are implanted with a photoresist 12 as the mask (FIG. 1A). An aluminum layer 13 of a thickness of 2000 Å (having a reflectivity of 95% at the wavelength of 308 nm) is coated on the implanted region, and the photoresist 12 is then removed. Because the aluminum layer 13 has a high reflectivity and a good heat conductivity, the aluminum layer 13 will become a cooling source after excimer laser annealing. The melt amorphous silicon thin film 11 will crystallize outwards from this cooling source until touching adjacent grains (FIGS. 1B and 1C).

The above method can effectively control the growth of grain in one dimension, but cannot accurately control the growth of grain in two or three dimensions, hence being not able to accomplish uniform grain size. In other words, the above method cannot control the grain size to achieve uniformity of device.

Figure 2:
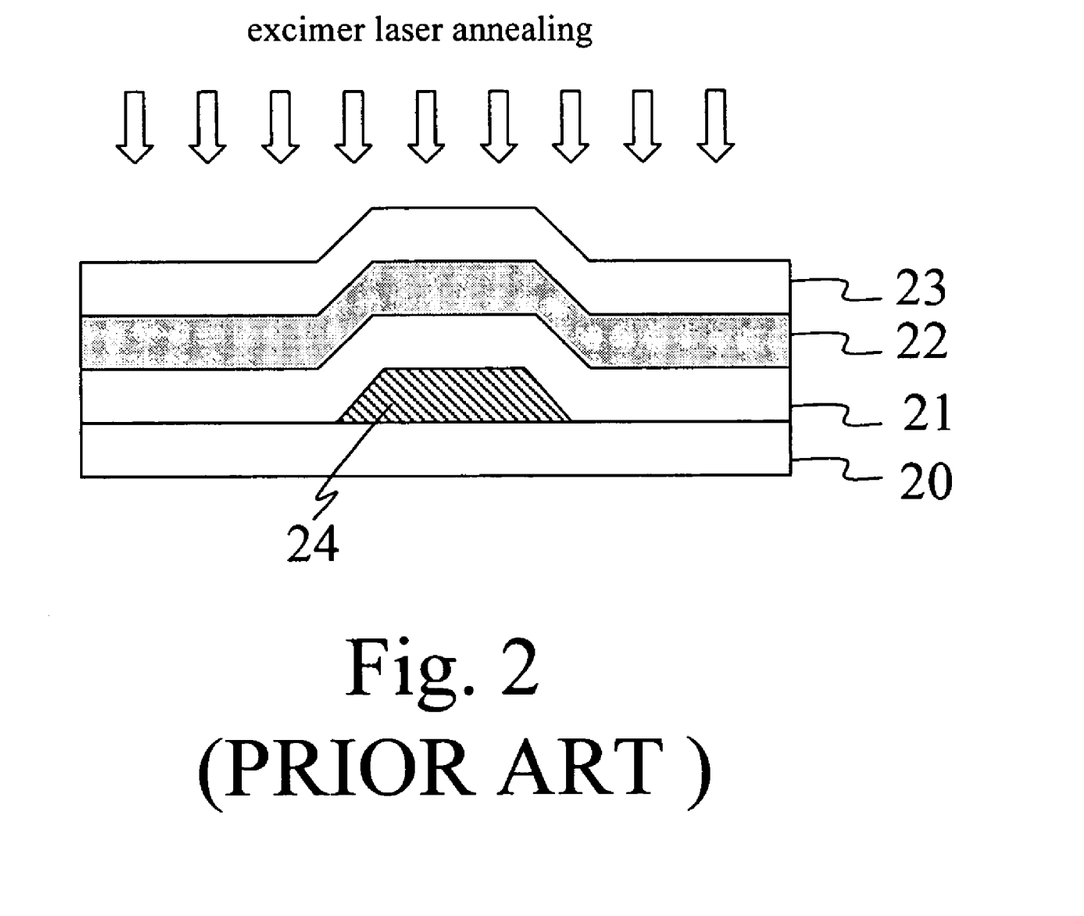
FIG. 2 is a structure diagram of a polysilicon thin film in the prior art.

In 2002, Seoul University of South Korea made use of the principle that it is more difficult for air to conduct heat than substrate to fabricate TFTs by means of sideward growth of poly Si. As shown in FIG. 2, a metal sacrifice layer of a thickness of 50 nm is first coated on a substrate 20. Next, an oxide 21 of a thickness of 100 nm is deposited at 390° C. using the plasma enhanced chemical vapor deposition (PECVD). An amorphous silicon thin film 22 of a thickness of 80 nm is then deposited at 280° C. Subsequently, dehydrogenation is performed for 3 hrs to avoid hydrogen explosion during excimer laser annealing. A thin oxide 23 is then deposited to avoid crack of a floating amorphous silicon layer due to laser annealing. Finally, the metal sacrifice layer is removed by etching to expose an air gap 24, and excimer laser annealing is performed. Because it is more difficult for air to conduct heat than the substrate 20, the substrate 20 will most of the heat to form a cooling source. The melt Si will crystallize inwards along the air gap 24 from the cooling source.

The grain grown by using the above method still extends in one dimension instead of two or three dimensions required for the requirement of uniformity. Moreover, different material stresses between thin films may arise during excimer laser annealing due to different thermal expansion coefficients between thin films above the air gap. Furthermore, because the bottoms of thin films are hollow, crack of thin films may easily occur to affect the stability of the fabrication process.

Figure 3A:
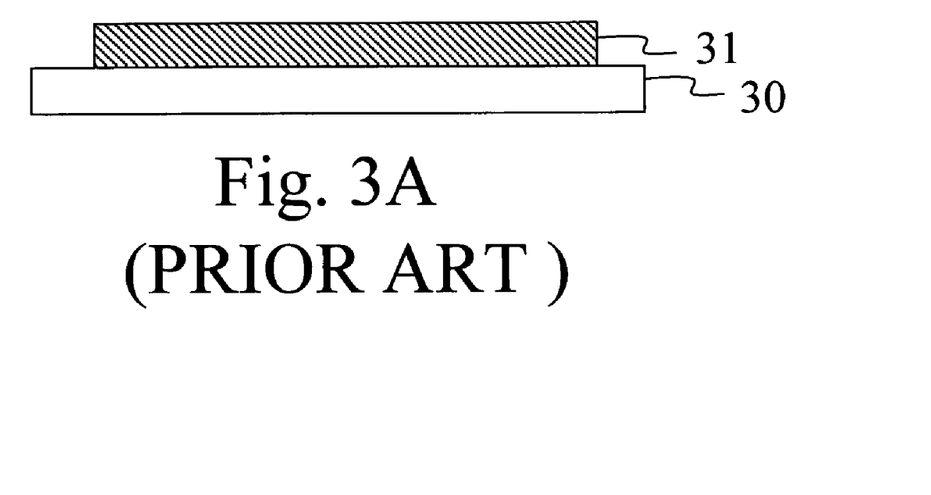
FIGS. 3A–3D show another polysilicon thin film fabrication process flow in the prior art.
Figure 3B:
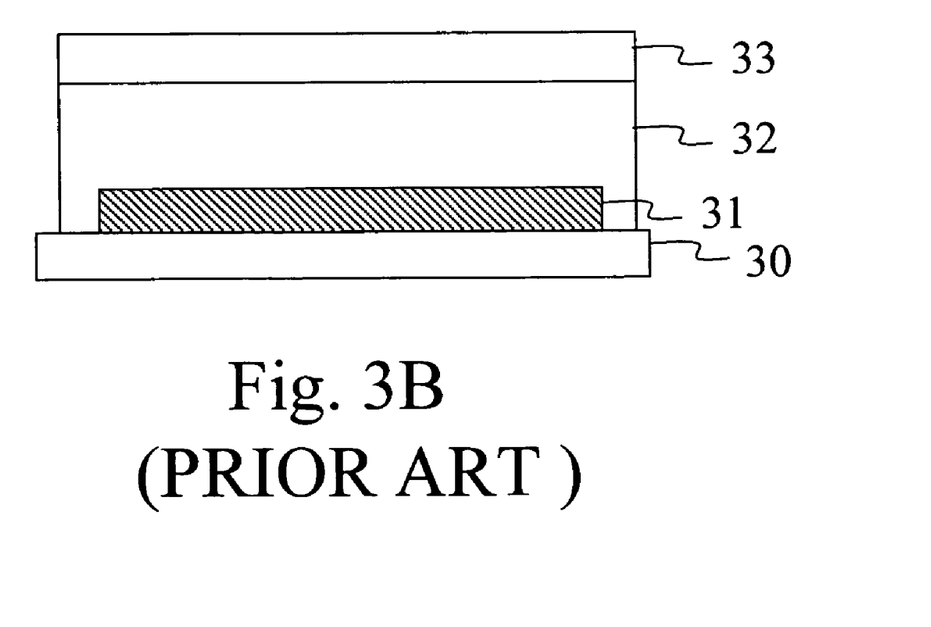
Figures 3C, 3D:
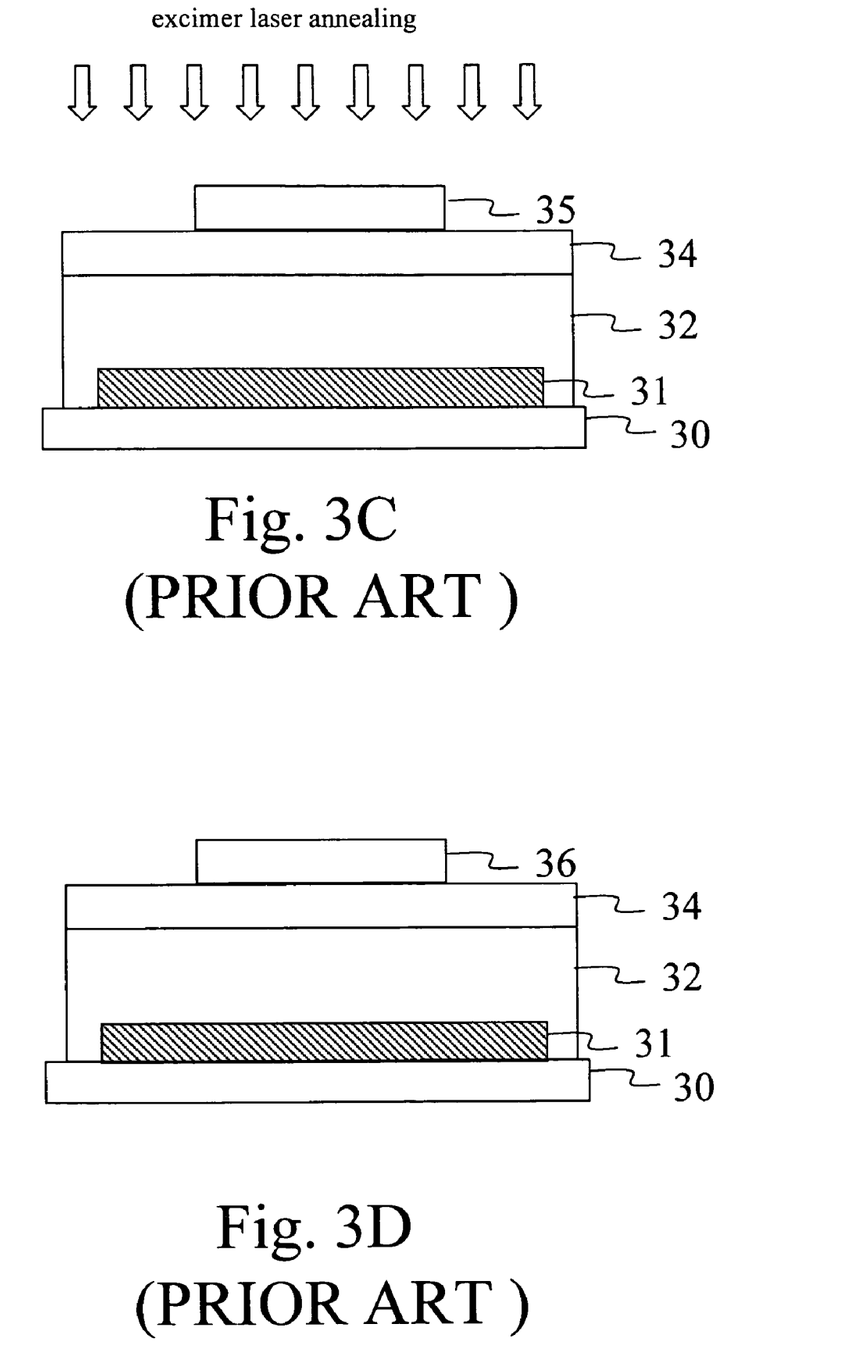

In 2004, the applicant has propose a method making use of silicon oxynitride (SiON) as a heat-absorbing layer to increase the crystallization size of melt Si. As shown in FIGS. 3A–3D, a SiON heat-absorbing layer 31 is first grown on a substrate 30 (FIG. 3A). Next, an oxide of a thickness of 10 nm is used as an insulating layer 32 to block the influence of the heat-absorbing layer 31 to nucleation of an amorphous silicon thin film thereon during recrystallization. After laser annealing, the heat-absorbing layer 31 will absorb a certain amount of heat to enhance its own temperature. Under the effect of high temperature of this layer, small grain crystallization of melt Si can be slowed down to enhance the growth of large grains. Subsequently, a bar-shaped amorphous silicon layer 33 is deposited on the insulating layer 32 (FIG. 3B). After excimer laser annealing, the amorphous silicon layer will become a polysilicon layer 34. An amorphous silicon layer 35 of a thickness of 50 nm is then deposited. After a excimer second laser annealing, the amorphous silicon layer 35 will crystallize into a polysilicon layer 36 with large grains through the induction of the bar-shaped polysilicon layer 34 and the function of the bottom heat-absorbing layer 31. Although the grain size can reach as high as 10 μm, the uniformity of grain in another direction cannot be controlled.

SUMMARY OF THE INVENTION

An object of the present invention is to provide a polysilicon thin film fabrication method, in which a regular heat-conducting layer is used as a cooling source to lead an amorphous silicon thin film to crystallize into a uniform polysilicon thin film, thereby solving the drawbacks in the prior art.

Another object of the present invention is to provide a polysilicon thin film fabrication method, whereby the crystallization of polysilicon thin film can be controlled to achieve uniform electrical properties, thereby improving the electrical characteristics of TFTs.

To achieve the above objects, the present invention proposes a polysilicon thin film fabrication method comprising the steps of: providing a substrate; depositing a heat-absorbing layer on the substrate; depositing an insulating layer on the heat-absorbing layer to block the influence of the heat-absorbing layer to nucleation of Si atoms; depositing an amorphous silicon thin film on the insulating layer; depositing a regular heat-conducting layer as a cooling source on the amorphous silicon thin film; and performing an annealing process to let the amorphous silicon thin film crystallize with the heat-conducting layer as the center and grow outwards to form a uniform polysilicon thin film with regularly arranged grains. Next, the heat-conducting layer can be removed without affecting the electrical properties of the polysilicon thin film. The numbers of grain and grain boundary in the polysilicon thin film channel of the TFT can thus be effectively controlled, and the electrical characteristics of TFTs can also be stably controlled, thereby improving the device uniformity of the whole drive circuit.

BRIEF DESCRIPTION OF THE DRAWINGS

The various objects and advantages of the present invention will be more readily understood from the following detailed description when read in conjunction with the appended drawing, in which.

DETAILED DESCRIPTION OF THE PREFERRED EMBODIMENTS

Figure 4:
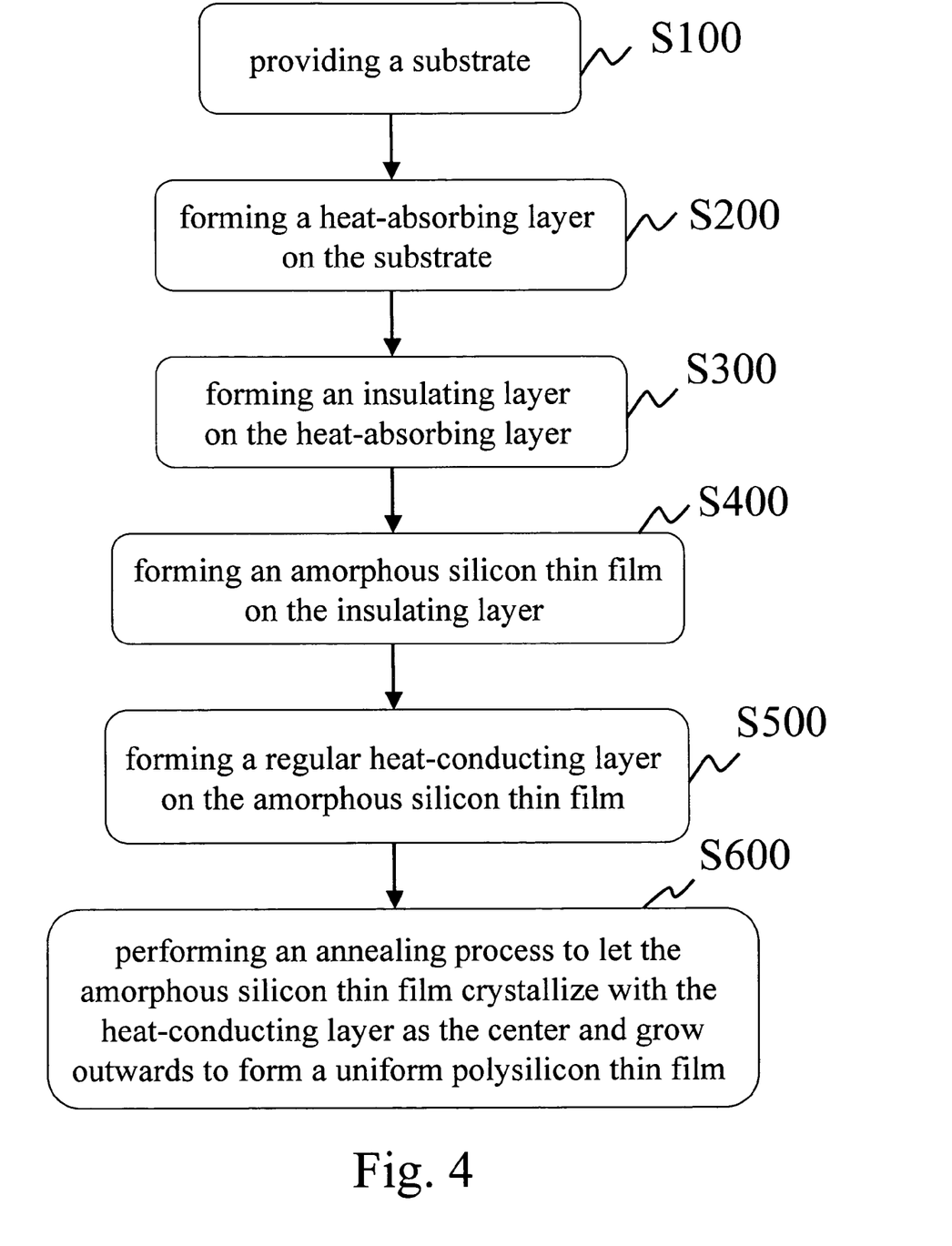
FIG. 4 is a flowchart of a polysilicon thin film fabrication method of the present invention.

As shown in FIG. 4, the present invention provides a polysilicon thin film fabrication method, which comprises the following steps.

First, a substrate is provided (Step S100). The substrate is a glass substrate, an insulator substrate, or a semiconductor substrate. Next, a heat-absorbing layer is formed on the substrate (Step S200). An insulating layer is then formed on the heat-absorbing layer (Step S300). Subsequently, an amorphous silicon thin film is formed on the insulating layer (Step S400). A regular heat-conducting layer is formed on the amorphous silicon thin film (Step S500). Finally, An annealing process is performed to let the amorphous silicon thin film crystallize with the heat-conducting layer as the center and grow outwards to form a uniform polysilicon thin film.

The present invention will be exemplified below with reference to FIGS. 5A–5H and FIGS. 6A–6C. The polysilicon thin film fabrication method of the present invention comprises the following steps.

Figure 5A:
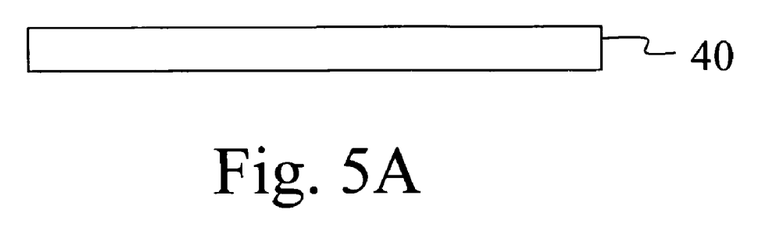
FIGS. 5A–5H are cross-sectional views of the process flow of the polysilicon thin film fabrication method of the present invention.

As shown in FIG. 5A, a glass substrate 40 is first provided.

Figure 5B:
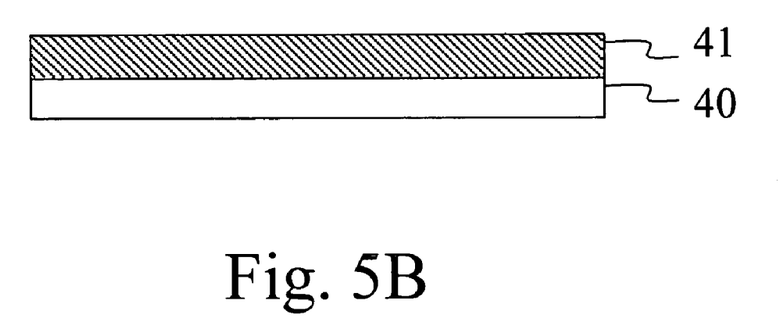

As shown in FIG. 5B, a silicon oxynitride (SiON) heat-absorbing layer 41 of a thickness of 500 nm is deposited on the glass substrate 40 at 250° C. by means of PECVD.

Figure 5C:
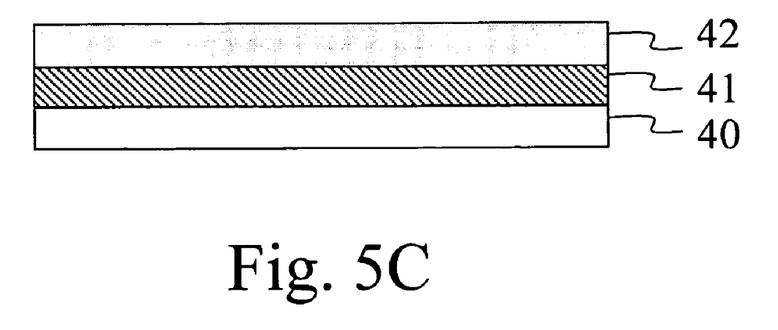

Next, as shown in FIG. 5C, a silicon oxide (SiOx) of a thickness of 10 nm as an insulating layer 42 is deposited at 250° C. by means of PECVD to block the influence of the SiON heat-absorbing layer 41 to nucleation of melt Si.

Figure 5D:
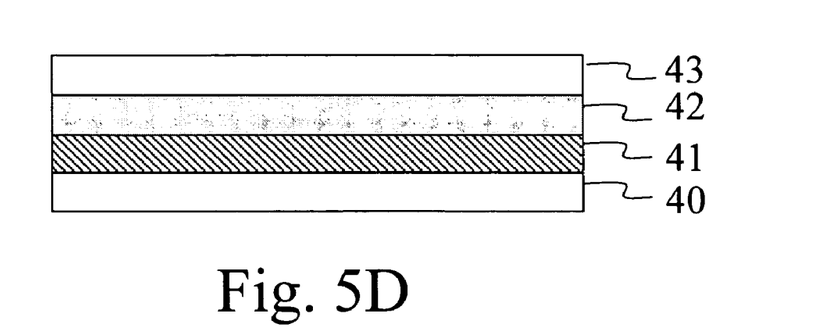

As shown in FIG. 5D, an amorphous silicon thin film 43 of a thickness of 50 nm is deposited on the insulating layer 42 at 250° C. by means of PECVD.

Figure 5E:
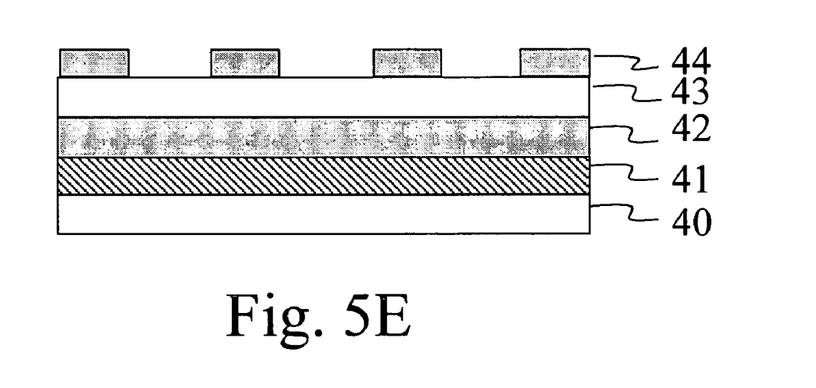
Figure 6A:
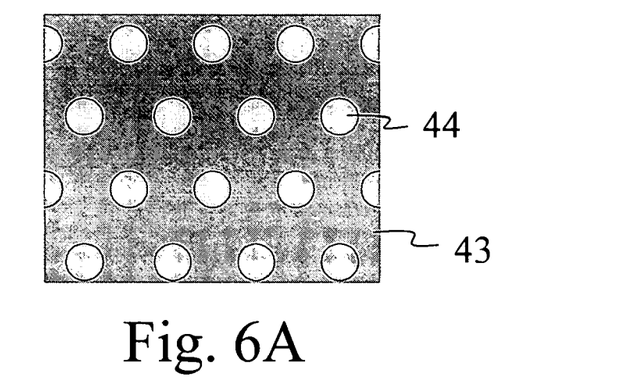
FIGS. 6A–6C are top views of the process flow of the polysilicon thin film fabrication method of the present invention.

As shown in FIGS. 5E and 6A, a regular aluminum heat-conducting layer 44 of a thickness of 300 nm is evaporated onto the amorphous silicon thin film 43.

Figure 5F:
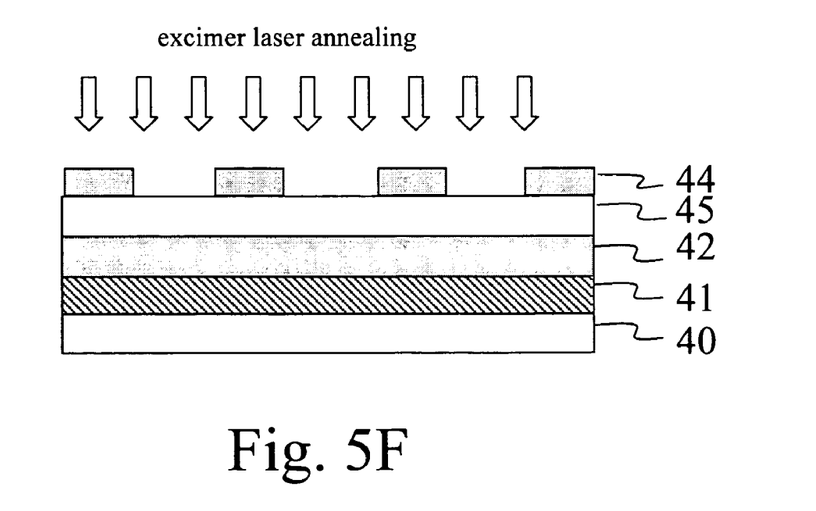
Figure 6B:
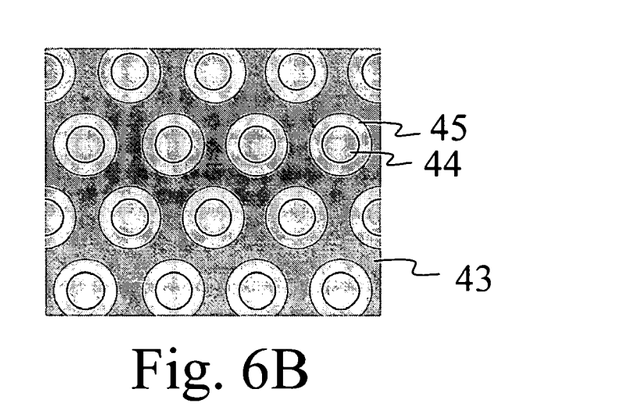
Figure 6C:
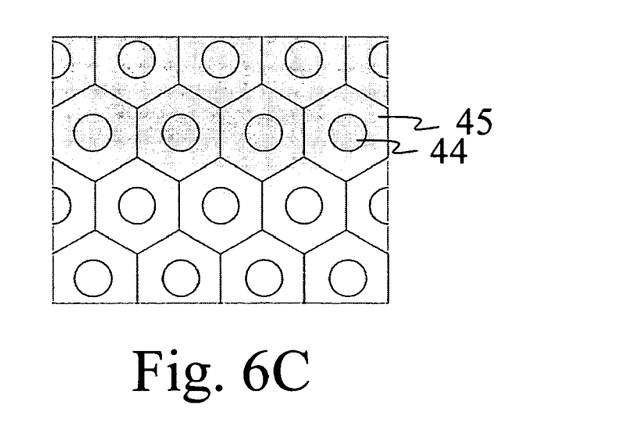

Subsequently, as shown in FIGS. 5F and 6B, an excimer laser is used to illuminate the amorphous silicon thin film 43 to form a polysilicon thin film 45. Meanwhile, the amorphous silicon thin film 43 will crystallize radially and outwards with the heat-conducting layer 44 as a cooling center. The distances between grains will be uniform due to regular arrangement to form the uniform polysilicon thin film 45, as shown in FIG. 6C. Although this embodiment adopts the excimer laser annealing (ELA) for annealing of amorphous silicon, it is also feasible to adopt a furnace annealing process.

Figure 5G:
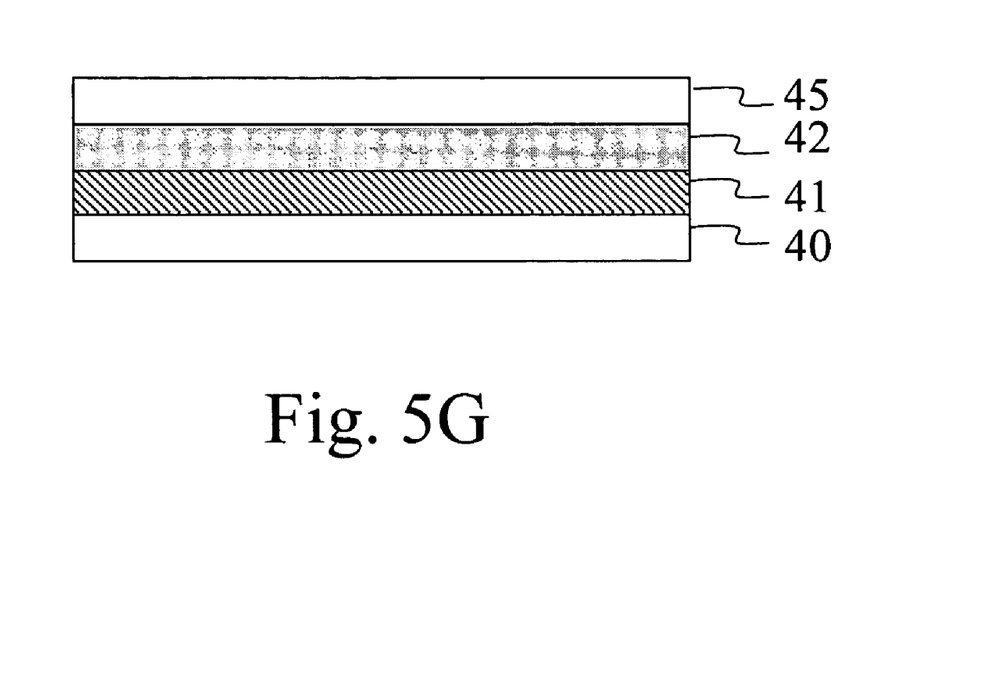

Finally, as shown in FIG. 5G, the heat-conducting layer 44 can be removed to apply to TFT.

Figure 5H:
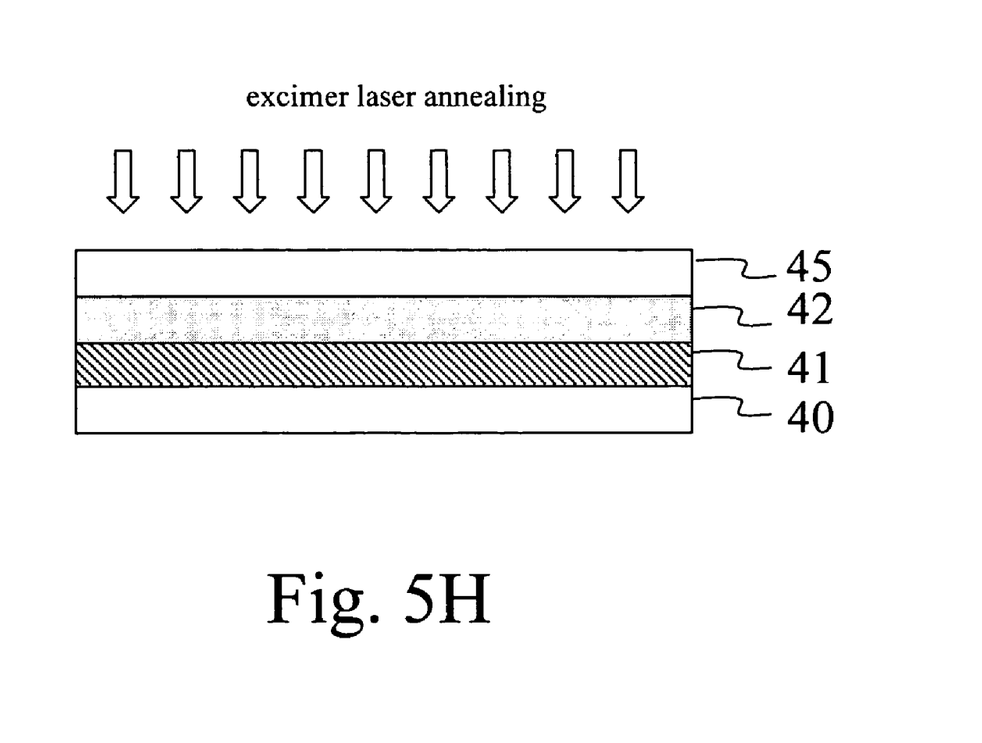

Besides, as shown in FIG. 5H, after the heat-conducting layer 44 is removed, several times of annealing can be performed to improve the influence of hillock of grain boundary of the polysilicon thin film 45 so as to lead the amorphous silicon thin film 43 covered by the heat-conducting layer 44 to crystallize inwards. Of course, the annealing can be the excimer laser annealing or the furnace annealing.

In practice, the heat-absorbing layer 41 in this embodiment can be made of other materials having a heat-absorbing function. Similarly, the insulating layer 42 can be made of other materials having an insulating function. The heat-conducting layer 44 can be made of metals or other materials having a good heat conductivity and a good reflectivity. Moreover, the arrangement of the materials having a good heat conductivity and a good reflectivity can be regular or irregular.

In this embodiment, an aluminum layer with a regular arrangement as photonic crystals is formed on the amorphous silicon thin film to control the crystallization position and grain size of melt Si. With also the use of the bottom heat-absorbing layer, grains will get sufficient heat during growth to slow down the formation of small grains and enhance the crystallization of large grains, thereby forming controllable polysilicon TFTs with uniform electrical characteristics. Besides, the metal can finally be removed without affecting the characteristics of TFT circuits fabricated thereon. Grain sizes and the number of grain boundary in polysilicon TFT channels can thus be controlled to stabilize the electrical characteristics of TFTs and improve the device uniformity of the whole drive circuit.

The polysilicon thin film fabrication method of the present invention makes use of regular photonic crystal arrays of the heat-conducting layer to lead the amorphous silicon to crystallize into the polysilicon thin film with uniform grain sizes. The fabricated polysilicon thin films can apply to TFT–LCDs or active matrix OLEDs.

The present invention can further effectively control the grain size and the number of grain boundary in channels of TFTs to improve uniformity of electrical characteristics between polysilicon transistors, thereby expanding the application range of LTPS. For example, when applied to active matrix drive devices, the phenomena of unstable current and uncontrollable current won't occur through the above way of grain control.

Moreover, the grain size of the fabricated polysilicon thin film in the present invention can be as large as 2 μm. Therefore, the device uniformity of polysilicon drive circuits used in LCDs and OLEDs can be greatly enhanced.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

We claim:

1. A polysilicon thin film fabrication method comprising the steps of:

providing a substrate;

forming a heat-absorbing layer on said substrate;

forming an insulating layer on said heat-absorbing layer;

forming an amorphous silicon thin film on said insulating layer;

forming a heat-conducting layer on said amorphous silicon thin film; and performing an annealing process to let said amorphous silicon thin film crystallize with said heat-conducting layer as the center and grow outwards to form a uniform polysilicon thin film.

2. The polysilicon thin film fabrication method as claimed in claim 1, wherein said substrate is a glass substrate, an insulating substrate, or a semiconductor substrate.

3. The polysilicon thin film fabrication method as claimed in claim 1, wherein said heat-absorbing layer is a SiON layer.

4. The polysilicon thin film fabrication method as claimed in claim 1, wherein said insulating layer is a SiOx layer.

5. The polysilicon thin film fabrication method as claimed in claim 1, wherein said heat-conducting layer is a metal layer.

6. The polysilicon thin film fabrication method as claimed in claim 1, wherein said annealing process is an excimer layer annealing or a furnace annealing.

7. The polysilicon thin film fabrication method as claimed in claim 1 further comprising a step of removing said heat-conducting layer after said step of forming said polysilicon thin film.

8. The polysilicon thin film fabrication method as claimed in claim 7 further comprising an annealing step to improve hillock of grain of said polysilicon thin film so as to lead said amorphous silicon thin film covered by said heat-conducting layer to crystallize into said polysilicon thin film after said step of removing said heat-conducting layer.

9. The polysilicon thin film fabrication method as claimed in claim 8, wherein said annealing process is an excimer laser annealing or a furnace annealing.

* * * * *